United States Patent
Jeong

[11] Patent Number: 5,821,587
[45] Date of Patent: Oct. 13, 1998

[54] FIELD EFFECT TRANSISTORS PROVIDED WITH ESD CIRCUIT

[75] Inventor: Jae Goan Jeong, Kyoongki-do, Rep. of Korea

[73] Assignee: Hyundai Electronics Industries Co., Ltd, Ichon-shi, Rep. of Korea

[21] Appl. No.: 871,851

[22] Filed: Jun. 9, 1997

[30] Foreign Application Priority Data

Jun. 24, 1996 [KR] Rep. of Korea ................. 1996-23269

[51] Int. Cl.$^6$ .................................................. H01L 23/62
[52] U.S. Cl. .......................... 257/355; 257/173; 257/546; 257/357
[58] Field of Search .................................... 257/173, 174, 257/355, 356, 357, 358, 359, 360, 361, 362, 363, 546

[56] References Cited

U.S. PATENT DOCUMENTS

| | | | |
|---|---|---|---|
| 5,198,683 | 3/1993 | Sivan | 257/67 |
| 5,414,277 | 5/1995 | Anzai | 257/368 |
| 5,475,268 | 12/1995 | Kawagoe et al. | 257/774 |
| 5,502,337 | 3/1996 | Nozaki | 257/774 |

FOREIGN PATENT DOCUMENTS

| | | | |
|---|---|---|---|
| 5-136295 | 6/1993 | Japan | 257/360 |
| 5-206292 | 8/1993 | Japan | 257/774 |
| 6-85249 | 3/1994 | Japan | 257/355 |

*Primary Examiner*—Carl W. Whitehead, Jr.
*Assistant Examiner*—Alice W. Tang
*Attorney, Agent, or Firm*—Thelen Reid & Priest LLP

[57] ABSTRACT

A semiconductor device provide with an ESD circuit including three active regions and element isolating regions formed on a semiconductor substrate in such a manner that the active regions are isolated from one another by the element isolating regions, source/drain diffusion regions respectively formed at the active regions, a first interlayer insulating film formed on the semiconductor substrate in such a manner that it covers the active regions and element isolating regions while being provided with first contact holes for exposing the diffusion regions, first lines formed on the first interlayer insulating film in such a manner that they are electrically connected to the diffusion regions via the first contact holes, respectively, a second interlayer insulating film formed over the entire exposed surface of the resulting structure obtained after the formation of the first line in such a manner that it has second contact holes for exposing the first line disposed over a central one of the active regions, and a second line formed on the second interlayer insulating film in such a manner that it is electrically connected to the exposed first line via the second contact holes.

13 Claims, 3 Drawing Sheets

FIELD EFFECT TRANSISTORS PROVIDED WITH ESD CIRCUIT

BACKGROUND OF THE INVENTION

1. Field of the Invention

The present invention relates to a semiconductor device provided with an ESD circuit, and more particularly to a semiconductor device provided with an ESD circuit which is structured to achieve high integration of the semiconductor device.

2. Description of the Prior Art

Generally, semiconductor devices have pads which have a signal input/output or address/control function. These pads have a desired area for achieving wire bonding in the fabrication of a package.

Such pads of a semiconductor device also contact leads which are exposed to the external portion of the semiconductor device. For this reason, the semiconductor device may be easily subjected to static electricity. In order to protect the semiconductor device from such static electricity, it is necessary to provide an ESD circuit between each pad and the internal circuit of the semiconductor device.

However, the provision of such an ESD circuit results in an increase in the chip size of the semiconductor device. In the case of a highly integrated semiconductor device including an increased number of pads by virtue of its complex function, the area of the ESD circuit increases in proportion to the increase in the number of pads. As a result, the increased area of the ESD circuit considerably affects the size of the chip.

In connection with this feature, an ESD circuit employed in general semiconductor devices will be described in conjunction with FIG. 1.

FIG. 1 is a circuit diagram illustrating an ESD circuit for control/address pads of a general semiconductor device.

As shown in FIG. 1, the ESD circuit, which is denoted by the reference numeral 200, is coupled to voltage sources Vcc and Vss via field transistors Q1 and Q2, respectively. The field transistors Q1 and Q2 are coupled to a control/address pad 100. The control/address pad 100 is connected to the gate of an input transistor Q3 via a resistor Rs. An active NMOS transistor Q4 is coupled to the output of the resistor Rs and the voltage source Vss.

When high voltage is applied to the pad 100, the field transistors Q1 and Q2 turn on, thereby causing the applied high voltage to be bypassed to the voltage source Vcc or Vss. Accordingly, the applied high voltage has no direct influence on the input transistor Q3.

Another ESD circuit employed in general semiconductor devices will be described in conjunction with FIG. 2.

FIG. 2 is a circuit diagram illustrating an ESD circuit for input/output pads of a general semiconductor device.

As shown in FIG. 2, the ESD circuit, which is denoted by the reference numeral 400, is coupled to voltage sources Vcc and Vss via an active NMOS transistor Q11 and an active PMOS transistor Q12, respectively. The transistors Q11 and Q12 are coupled to an input/output pad 300. An input transistor Q13 is also connected to the input/output pad 300.

When high voltage is applied to the pad 300, the NMOS and PMOS transistors Q11 and Q12 are turned on, thereby causing the applied high voltage to be bypassed to the voltage source Vcc or Vss. Accordingly, the applied high voltage has no direct influence on the input transistor Q3.

A semiconductor device provided with an ESD circuit having a conventional configuration will be described in conjunction with FIG. 3.

FIG. 3 illustrates the layout of the semiconductor device including the ESD circuit which has has configuration shown in FIG. 1.

As shown in FIG. 3, the semiconductor device includes two pairs of isolated active regions 15 arranged on opposite sides of a metal layer 19 while being spaced from the metal layer 19, respectively.

A mask 14 is also arranged on each active region pair in order to implant impurity ions in the active regions 15, thereby forming a source/drain region.

Contact holes 17a are formed in insulating film layer 17 above outer active regions 15 of each active region pair, so as to form contacts for a first metal layer 19 which is disposed over the active regions 15. A contact hole 21a is formed in a second insulating film layer 21 above first metal layer 19, and allows part of second metal layer 23 to contact the first metal layer 19.

An element isolating region is defined beneath the second metal layer 23 which is used as a pad. Field transistors are formed on opposite sides of the element isolating region. As a result, the resulting semiconductor device has an increased area.

FIG. 4 is a cross-sectional view taken along the line IV—IV of FIG. 3.

As shown in FIG. 4, element isolation films 13 and 13a are formed on a semiconductor substrate 11 in field regions in order to define active regions in the semiconductor substrate 11. Impurity ions are then implanted in the active regions of the semiconductor substrate 11, thereby forming diffusion regions 15 for source/drain regions.

Thereafter, a first interlayer insulating film 17 is formed over the resulting structure. The first interlayer insulating film 17 is then selectively removed, thereby forming contact holes 17a for exposing the diffusion regions 15.

A first metal layer 19 is subsequently deposited over the entire exposed surface of the resulting structure. The first metal layer 19 is then etched in accordance with an etch process, thereby forming a first-metal layer pattern.

A second interlayer insulating film 21 is then formed over the entire exposed surface of the resulting structure. The second interlayer insulating film 21 is then selectively removed, thereby forming a second contact hole 21a.

Thereafter, a second metal layer 23 is deposited over the entire exposed surface of the resulting structure. The second metal layer 23 is then selectively etched, thereby forming a second-metal layer pattern which is used as a pad.

However, the semiconductor device including the conventional ESD circuit having the above-mentioned structure has the following problem.

The element isolating film, which is disposed beneath the metal layer used as a pad, occupies a large area in the semiconductor device, but has no particular function. As a result, it is difficult to reduce the effective area of the ESD circuit in the semiconductor device.

Consequently, the above-mentioned ESD circuit is improper for highly integrated semiconductor devices.

SUMMARY OF THE INVENTION

An objective of the invention is to solve the above-mentioned problem involved in the prior art and to provide a semiconductor device with an ESD circuit having a configuration capable of reducing the area of the ESD circuit occupied in the semiconductor device.

Another objective of the invention is to provide a semiconductor device with an ESD circuit capable of maximizing the linewidth of power lines, thereby eliminating the generation of noise while achieving an improvement in the reliability and static electricity latch-up characteristic of the semiconductor device.

Another objective of the invention is to provide a semiconductor device with an ESD circuit having a configuration capable of achieving a high integration of the semiconductor device.

In accordance with the present invention, these objects are accomplished by providing a semiconductor device with an ESD circuit comprising: a semiconductor substrate; three active regions and element isolating regions formed on the semiconductor substrate in such a manner that the active regions are isolated from one another by the element isolating regions; source/drain diffusion regions respectively formed at the active regions; a first interlayer insulating film formed on the semiconductor substrate in such a manner that it covers the active regions and element isolating regions while being provided with first contact holes for exposing the diffusion regions; first lines formed on the first interlayer insulating film in such a manner that they are electrically connected to the diffusion regions via the first contact holes, respectively; a second interlayer insulating film formed over the entire exposed surface of the resulting structure obtained after the formation of the first line in such a manner that it has second contact holes for exposing the first line disposed over a central one of the active regions; and a second line formed on the second interlayer insulating film in such a manner that it is electrically connected to the exposed first line via the second contact holes.

BRIEF DESCRIPTION OF THE DRAWINGS

Other objectives and aspects of the invention will become apparent from the following description of embodiments with reference to the accompanying drawings in which.

DETAILED DESCRIPTION OF THE PREFERRED EMBODIMENTS

Figure 5:
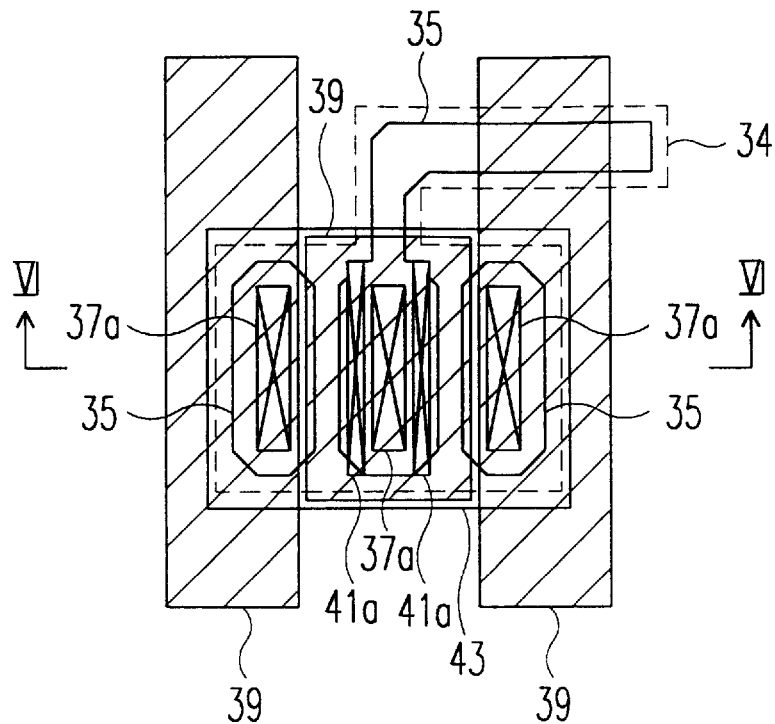
FIG. 5 is a plane view illustrating the layout of an ESD circuit having a configuration according to the present invention.

FIG. 5 illustrates the layout of an ESD circuit having a configuration according to the present invention.

As shown in FIG. 5, three active regions 35, which are isolated from one another, are disposed beneath a second metal layer 43 in such a manner that they overlap with the second metal layer 43.

A mask 34 is also arranged on each active region 35 in order to implant impurity ions in the active region 35, thereby forming a source/drain region.

Contact holes 37a are formed through first insulating layer 37 above active regions 35 to form contacts between a first metal layer 39 and the active regions. Contact holes 41a are formed above first metal layer 39 through second insulating layer 41, and allow part of second metal layer 43 to contact the first metal layer 39.

Since the active regions 35 overlap with the second metal layer 43 used as a pad, it is possible to reduce the entire area of the semiconductor device.

Figure 6:
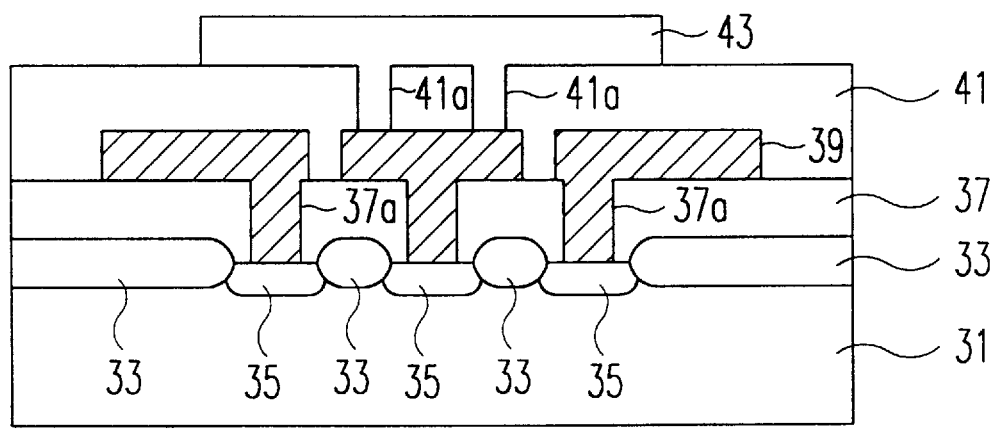
FIG. 6 is a cross-sectional view taken along the line VI—VI of FIG. 5.

FIG. 6 is a cross-sectional view taken along the line VI—VI of FIG. 5.

As shown in FIG. 6, an element isolation film 33 is formed on a semiconductor substrate 31 in field regions in order to define active regions in the semiconductor substrate 11. Impurity ions are then implanted in the active regions of the semiconductor substrate 31, thereby forming diffusion regions 35 for source/drain regions.

Thereafter, an insulating film 37 is formed over the resulting structure. The insulating film 37 is then selectively removed, thereby forming contact holes 37a for exposing the diffusion regions 35.

A first metal layer 39 is subsequently deposited over the entire exposed surface of the resulting structure. The first metal layer 39 is then etched in accordance with an etch process, thereby forming a first-metal layer pattern.

A second interlayer insulating film 41 is then formed over the entire exposed surface of the resulting structure. The second interlayer insulating film 41 is then selectively removed, thereby forming second contact holes 41a.

Thereafter, a second metal layer 43 is deposited over the entire exposed surface of the resulting structure. The second metal layer 43 is then selectively etched, thereby forming a second-metal layer pattern which is used as a pad. The active regions are disposed beneath the second-metal layer pattern.

Figure 1:
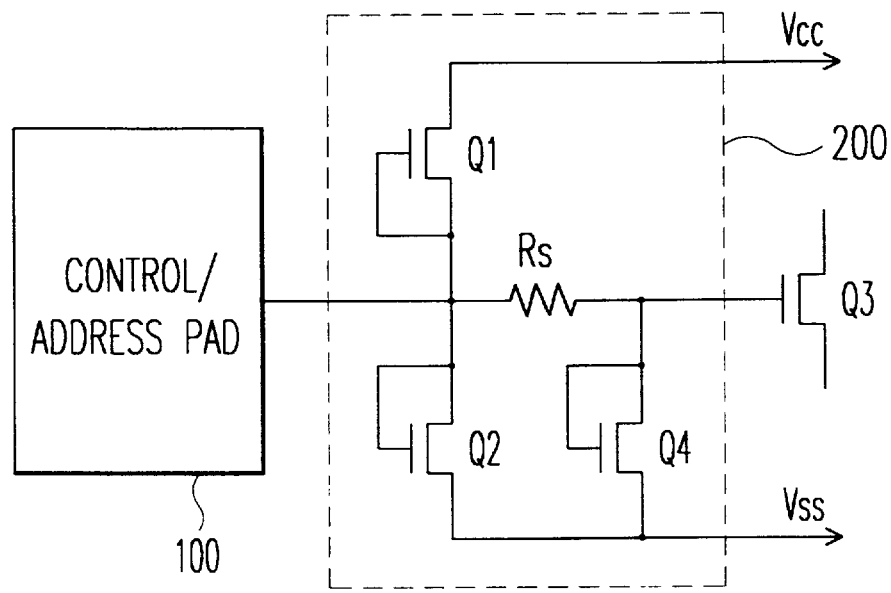
FIG. 1 is a circuit diagram illustrating an ESD circuit for control/address pads of a general semiconductor device.
Figure 2:
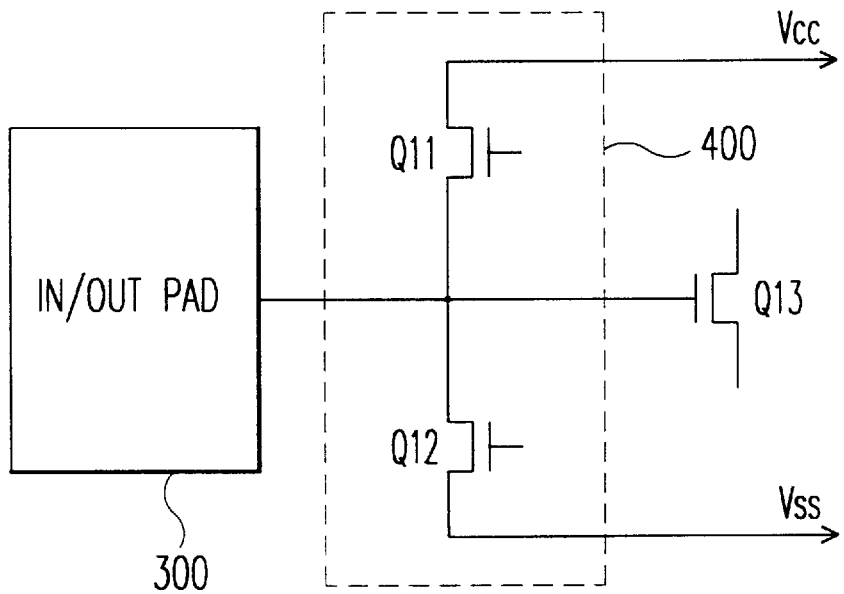
FIG. 2 is a circuit diagram illustrating an ESD circuit for input/output pads of a general semiconductor device.
Figure 3:
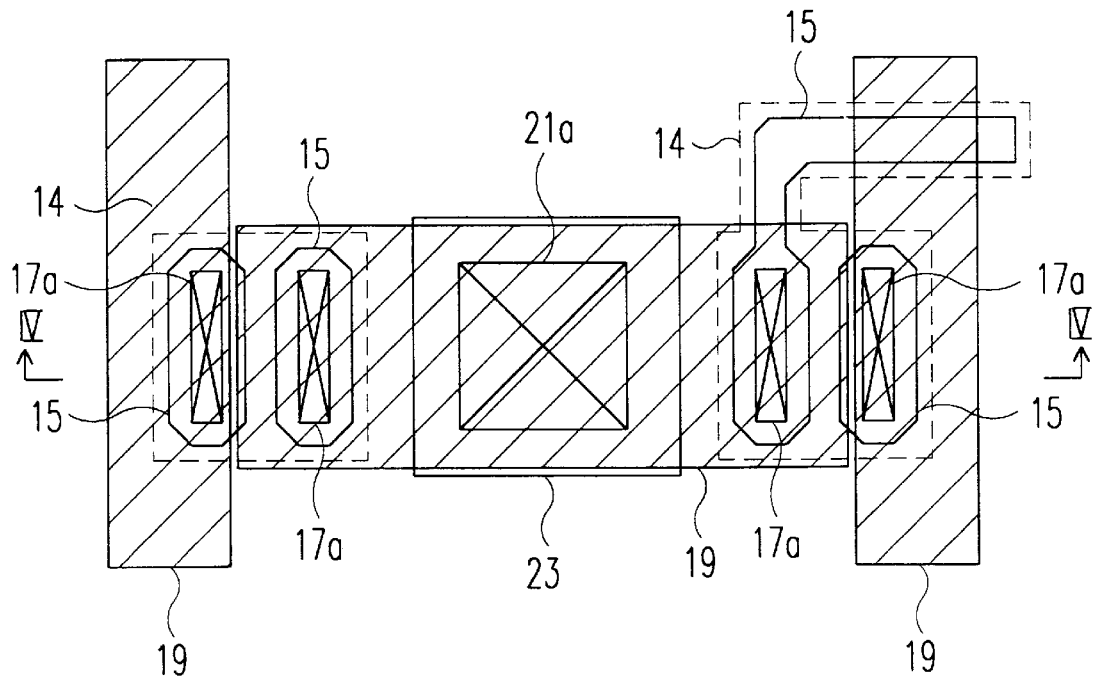
FIG. 3 is a plane view illustrating the layout of the semiconductor device including the ESD circuit which has a configuration shown in FIG. 1.
Figure 4:
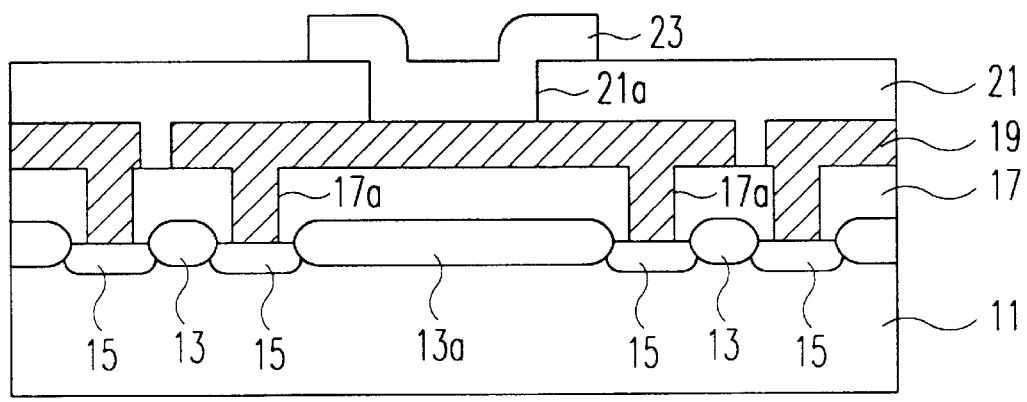
FIG. 4 is a cross-sectional view taken along the line IV—IV of FIG. 3.

Field transistors, which correspond to the field transistors Q1 and Q2 of FIG. 1, are formed in the active regions, respectively. Accordingly, it is possible to minimize the entire area of the semiconductor device.

As shown in FIG. 6, the patterned second metal layer 43 overlaps completely with the contacts of the first metal layer 39 which are used as conductive lines for voltage sources Vcc and Vss.

The patterned second metal layer 43, which is used as a pad, is also used as an input/output or address/control pad.

The diffusion regions 35 may have an n-type or p-type conductivity. The element isolating film 33, which is arranged between adjacent diffusion regions, may have a minimum pattern size.

As is apparent from the above description, the semiconductor device provided with the ESD circuit having the above-mentioned configuration in accordance with the present invention has various effects.

That is, it is possible to effectively reduce the chip size because the field transistors used for the ESD circuit are disposed beneath the second metal layer pattern which is used as a pad.

Accordingly, the linewidth of the power lines is maximized, thereby eliminating the generation of noise while achieving an improvement in the reliability and static electricity latch-up characteristic of the semiconductor device. Therefore, the present invention provides a semiconductor device with an ESD circuit having a configuration capable of achieving high integration of the semiconductor device.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor device comprising:

a semiconductor substrate;

three active regions that are formed in the semiconductor substrate and arranged linearly, side by side;

element isolation regions formed in the semiconductor substrate in such a manner as to isolate the active regions from one another;

source/drain diffusion regions of field effect transistors of an electrostatic discharge (ESD) circuit, formed at respective active regions;

a first interlayer insulating film formed to cover the three active regions and element isolating regions while being provided with first contact holes for exposing the three diffusion regions;

first lines formed on the first interlayer insulating film in such a manner that they are electrically connected to respective diffusion regions via respective first contact holes;

a second interlayer insulating film formed over an exposed surface of the first interlayer insulating film and the first lines in such a manner that the second interlayer insulating film has second contact holes for exposing portions of a central first line of the first lines that is disposed over a central active region of the three active regions; and a second line formed on the second interlayer insulating film in such a manner that the second line is electrically connected to the central first line via the second contact holes, and completely overlaps the field effect transistors of the ESD circuit.

2. The semiconductor device in accordance with claim 1, wherein:

the first lines are power lines.

3. The semiconductor device in accordance with claim 1, wherein:

the second line is in contact with the first line via two second contact holes.

4. The semiconductor device in accordance with claim 1, wherein:

the second contact holes are disposed on opposite sides of the first contact hole that is disposed over the central active region.

5. The semiconductor device in accordance with claim 1, wherein:

the second line overlaps with the central first line.

6. The semiconductor device in accordance with claim 1, wherein:

the second line overlaps with the first lines.

7. The semiconductor device in accordance with claim 1, wherein:

the second line is an input/output pad.

8. The semiconductor device in accordance with claim 1, wherein:

the second line is an address pad.

9. The semiconductor device in accordance with claim 1, wherein:

the second line is a control pad.

10. A semiconductor device comprising:

a semiconductor substrate;

three active regions that are formed in the semiconductor substrate and arranged linearly, side by side;

element isolation regions formed in the semiconductor substrate in such a manner as to isolate the active regions from one another;

source/drain diffusion regions of field effect transistors of an electrostatic discharge (ESD) circuit, formed at respective active regions;

a first interlayer insulating film formed to cover the three active regions and element isolating regions while being provided with first contact holes for exposing the three diffusion regions;

power lines formed on the first interlayer insulating film in such a manner that they are electrically connected to respective diffusion regions via respective first contact holes;

a second interlayer insulating film formed over an exposed surface of the first interlayer insulating film and the power lines in such a manner that the second interlayer insulating film has second contact holes for exposing portions of a central power line of the power lines that is disposed over a central active region of the three active regions; and a pad line, formed on the second interlayer insulating film in such a manner that the pad line is electrically connected to the central power line via the second contact holes, and completely overlaps the field effect transistors of the ESD circuit.

11. The semiconductor device of claim 10, wherein:

the pad line is an input/output pad.

12. The semiconductor device of claim 10, wherein:

the pad line is an address pad.

13. The semiconductor device of claim 10, wherein:

the pad line is a power pad.

* * * * *